(12) United States Patent
Shen

(10) Patent No.: US 12,206,436 B2
(45) Date of Patent: Jan. 21, 2025

(54) Δ-Σ AD CONVERTER AND SENSOR DEVICE

(71) Applicant: ABLIC Inc., Tokyo (JP)

(72) Inventor: Biao Shen, Tokyo (JP)

(73) Assignee: ABLIC Inc., Nagano (JP)

( * ) Notice: Subject to any disclaimer, the term of this patent is extended or adjusted under 35 U.S.C. 154(b) by 184 days.

(21) Appl. No.: 18/179,346

(22) Filed: Mar. 6, 2023

(65) Prior Publication Data
US 2023/0318618 A1 Oct. 5, 2023

(30) Foreign Application Priority Data

Mar. 29, 2022 (JP) .................. 2022-052714

(51) Int. Cl.
*H03M 3/00* (2006.01)
*H03M 1/12* (2006.01)
(52) U.S. Cl.
CPC ............ *H03M 3/458* (2013.01); *H03M 1/12* (2013.01)
(58) Field of Classification Search
CPC ................ H03M 3/458; H03M 1/12
USPC .................. 341/118, 120, 155, 143
See application file for complete search history.

(56) References Cited

U.S. PATENT DOCUMENTS

| | | | | |
|---|---|---|---|---|
| 6,847,319 | B1* | 1/2005 | Stockstad | G01K 7/01 374/E7.035 |
| 2001/0038350 | A1* | 11/2001 | Andre | G02B 17/0808 341/118 |
| 2010/0002747 | A1 | 1/2010 | Bosch et al. | |

FOREIGN PATENT DOCUMENTS

JP 2011527009 10/2011

* cited by examiner

*Primary Examiner* — Peguy Jean Pierre
(74) *Attorney, Agent, or Firm* — JCIPRNET

(57) ABSTRACT

The present invention provides a ΔΣ AD converter and a sensor device having a small circuit scale and high conversion accuracy. A ΔΣ AD converter includes a ΔΣ AD modulator, an accumulator, a counter, an adjustment value storage part, a first adder, a cumulative value latch part, and a control circuit. The control circuit outputs to the adjustment value storage part a signal designating a temperature range according to the adjustment cumulative value received from the first adder in a case where the count value received from the counter reaches a predetermined value. The adjustment value storage part outputs the adjustment value of the offset value and the adjustment value of the count value according to the signal to the first adder and the counter. The control circuit outputs the latch signal to the cumulative value latch part in response to completion of counting by the counter.

13 Claims, 4 Drawing Sheets

Δ-Σ AD CONVERTER AND SENSOR DEVICE

CROSS-REFERENCE TO RELATED APPLICATION

This application claims the priority benefit of Japan application serial no. 2022-052714, filed on Mar. 29, 2022. The entirety of the above-mentioned patent application is hereby incorporated by reference herein and made a part of this specification.

BACKGROUND

Technical Field

The present invention relates to a ΔΣ AD converter and a sensor device.

Description of Related Art

FIG. 4 is a block diagram illustrating the configuration of a conventional high-accuracy digital temperature sensor device.

A temperature sensor device 500 includes an analog temperature sensor 50, a ΔΣ AD converter 51, a digital filter 52, a comparator 53, a backend scaling 54 and a reference voltage circuit 55.

In the conventional temperature sensor device 500, the analog temperature sensor 50 and the ΔΣ AD converter 51 have inherent gain/offset. Thus, the raw digital data output from the digital filter 52 is error reduced by the comparator 53 and the backend scaling 54 applying different gains/offsets corresponding to different temperatures.

Specifically, the digital data of the digital filter 52 is compared with threshold data in the comparator 53 and adjusted with a gain/offset corresponding to the region determined in the backend scaling 54 (see, for example, Japanese Patent Application Laid-Open No. 2011-527009).

SUMMARY

Technical Problem

However, the backend scaling 54, which adjusts the raw digital data with gain/offset, requires a multiplier circuit, so the circuit size is large. Furthermore, if the number of digits of the multiplication coefficient is increased for higher accuracy, the scale of the multiplier circuit will be further increased.

Thus, the conventional temperature sensor device 500 has a problem that the area occupied by the circuit increases and the cost increases in order to improve the accuracy.

The present invention provides a ΔΣ AD converter and a sensor device having a small circuit scale and high conversion accuracy.

Solution to Problem

A ΔΣ AD converter according to an embodiment of the present invention is a ΔΣ AD converter which converts an input analog signal into a digital signal, and the ΔΣ AD converter includes:

a ΔΣ AD modulator which receives the analog signal and outputs a modulated signal;

an accumulator which accumulates the modulated signal and outputs a cumulative value;

a counter which counts a set count value;

an adjustment value storage part which stores an adjustment value of the count value and an adjustment value of an offset value;

a first adder which outputs an adjustment cumulative value obtained by adding the cumulative value and the adjustment value of the offset value;

a cumulative value latch part which receives the adjustment cumulative value; and a control circuit which receives the adjustment cumulative value, the count value from the counter, and a threshold value of the adjustment cumulative value for determining a temperature range from the adjustment value storage part, and outputs a control signal to the counter and a latch signal to the cumulative value latch part.

The control circuit determines the temperature range according to the adjustment cumulative value received from the first adder in a case where the count value received from the counter reaches a predetermined value, and outputs a signal designating the temperature range to the adjustment value storage part.

The adjustment value storage part outputs the adjustment value of the offset value and the adjustment value of the count value according to the designated temperature range to the first adder and the counter.

The control circuit outputs the latch signal to the cumulative value latch part in response to completion of counting by the counter.

Effects

According to the present invention, it is possible to provide a ΔΣ AD converter and a sensor device having a small circuit scale and high conversion accuracy.

DESCRIPTION OF EMBODIMENTS

Hereinafter, embodiments of the present invention will be described with reference to the drawings.

Figure 1:
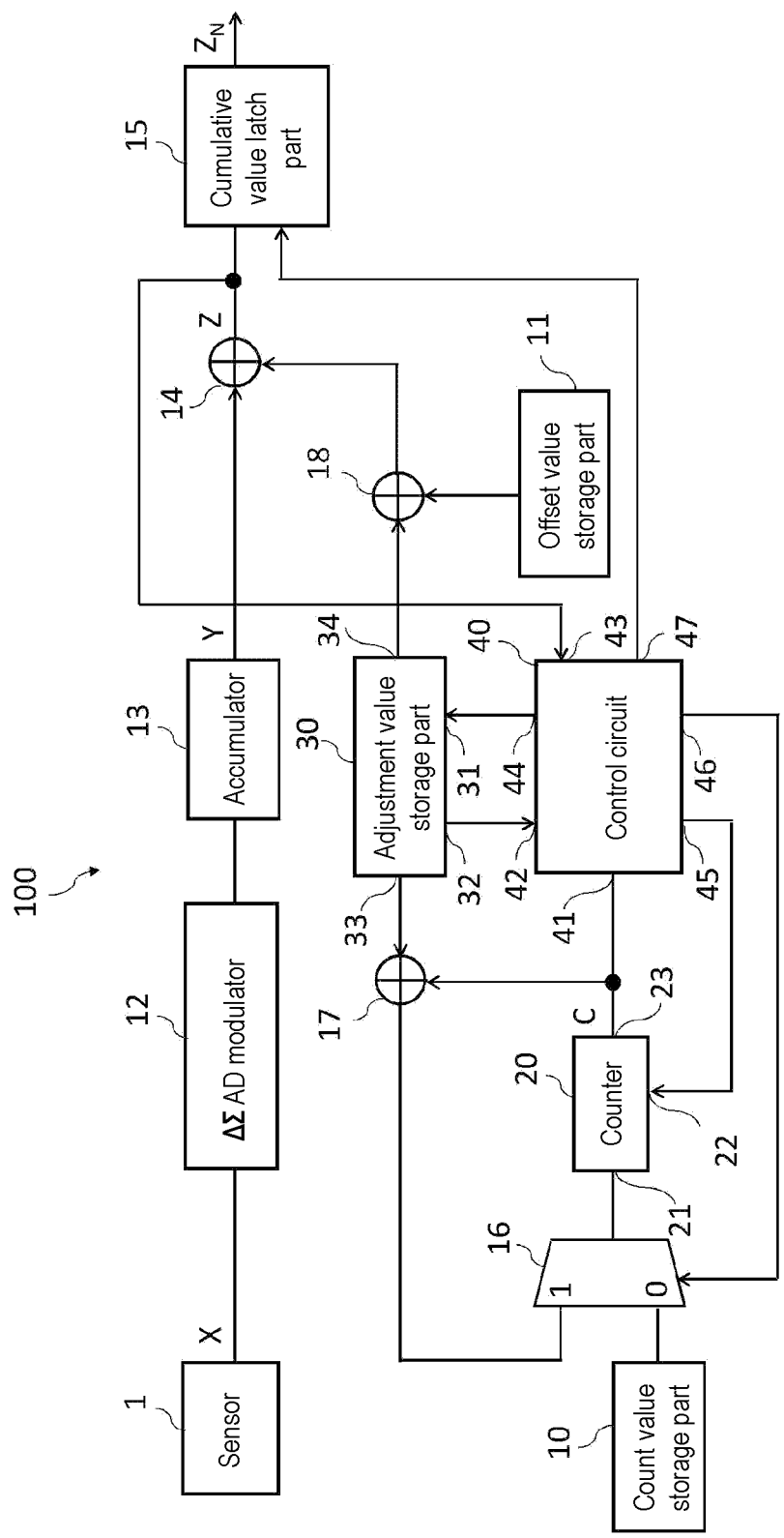
FIG. 1 is a block diagram illustrating a sensor device according to an embodiment.

FIG. 1 is a block diagram illustrating a sensor device according to an embodiment.

A sensor device 100 includes a sensor 1 and a ΔΣ AD converter. The ΔΣ AD converter includes a count value storage part 10, an offset value storage part 11, a ΔΣ AD modulator 12, an accumulator 13, an adder 14, a cumulative value latch part 15, a multiplexer 16, adders 17 and 18, a counter 20, an adjustment value storage part 30, and a control circuit 40. These circuits operate in response to clock signals, but are omitted from the drawings and description.

The sensor 1 outputs to the ΔΣ AD modulator 12 an analog signal X corresponding to physical information (for example, temperature) that has been measured. The ΔΣ AD modulator 12 modulates the analog signal X and outputs it to the accumulator 13. The accumulator 13 outputs a cumulative value Y corresponding to the analog signal X to the adder 14. The adder 14 adds the cumulative value Y of the accumulator 13 and the offset value of the adder 18 and outputs an adjustment cumulative value Z. The count value storage part 10 stores an initial value of the count values. The offset value storage part 11 stores an initial value of the offset values. The adjustment value storage part 30 stores the threshold value of the adjustment cumulative value Z which determines the temperature range for adjustment, the adjustment value of the count value corresponding to that region, and the adjustment value of the offset value. The adder 17 adds the count value of the counter 20 and the adjustment value of the count value of the adjustment value storage part 30 and outputs an adjustment count value. The adder 18 adds the initial value of the offset value of the offset value storage part 11 and the adjustment value of the offset value of the adjustment value storage part 30 and outputs the result. The counter 20 loads the count value and counts down the count value according to a control signal from the control circuit 40. The control circuit 40 receives the count value from the counter 20, the adjustment cumulative value Z from the adder 14, and the threshold value of the adjustment cumulative value Z which determines the temperature range for adjustment from the adjustment value storage part 30, and outputs control signals to the multiplexer 16, the counter 20, the adjustment value storage part 30, and the cumulative value latch part 15. The multiplexer 16, in response to receiving a control signal from the control circuit 40 at its control port, outputs one of the initial value of the count value of the count value storage part 10 and the adjustment count value of the adder 17. The cumulative value latch part 15, in response to receiving a latch signal from the control circuit 40 at its control port, latches the adjustment cumulative value Z output from the adder 14, and outputs a signal ZN, which is an output signal of the sensor device 100, from the output port.

The ΔΣ AD modulator 12 is, for example, a first-order ΔΣ AD modulator, and in the case of a binary output of "0" and "1," the density of output data "1" is uniform and depends on the temperature. The accumulator 13 accumulates the data output from the ΔΣ AD modulator 12 and outputs the cumulative value Y. The offset value is added to the cumulative value Y by the adder 14, and the cumulative value latch part 15 receives the adjustment cumulative value Z. That is, the adjustment cumulative value Z is first-order corrected by the initial value of the count value and the value of the offset value.

The characteristics of the analog signal X corresponding to the physical information (for example, temperature) output by the sensor 1 and the ΔΣ modulator 12 are generally second-order or higher nonlinear characteristics, and the accuracy cannot be guaranteed by the first-order correction. Thus, the ΔΣ AD converter of this embodiment corrects the cumulative value Y output by the accumulator 13 by polygonal line approximation. That is, the ΔΣ AD converter of this embodiment corrects the nonlinear characteristics of the analog signal X and the ΔΣ modulator 12 collectively, so that accuracy may be guaranteed.

Specifically, the control circuit 40 determines the temperature range from the threshold value of the adjustment cumulative value $Z_M$ and the adjustment cumulative value Z according to the count value C counting down a predetermined value M (for example, ½ of the initial value), and designates the adjustment value to be selected to the adjustment value storage part 30. The adjustment value storage part 30 outputs the adjustment value designated by the control circuit 40. The adder 17 outputs a new count value obtained by adding the adjustment value to the count value M. The multiplexer 16 outputs the new count value received from the adder 17 according to an instruction of the control circuit 40. The counter 20 loads the new count value and starts counting down according to an instruction of the control circuit 40. The adder 18 outputs a new offset value obtained by adding the adjustment value of the offset value to the initial value of the offset value. The adder 14 outputs the adjustment cumulative value Z obtained by adding the new offset value to the cumulative value Y. The control circuit 40 outputs a latch signal to the cumulative value latch part 15 upon completion of the countdown of the new count value by the counter 20, and determines the digital signal ZN. In other words, the adjustment cumulative value Z is newly subjected to first-order correction by the adjustment count value and the adjustment offset value corresponding to the temperature range, and thus the nonlinear characteristic is corrected by the polygonal line approximation. The polygonal line approximation correction of the adjustment cumulative value Z as described above may be realized by using a cumulative ΔΣ AD converter.

The operation of the sensor device 100 according to this embodiment will be described below with reference to the drawings.

In the case of activating the sensor device 100, the ΔΣ AD modulator 12, the accumulator 13, the counter 20, and the like are reset, but they are omitted from the drawings and description.

Figure 2:
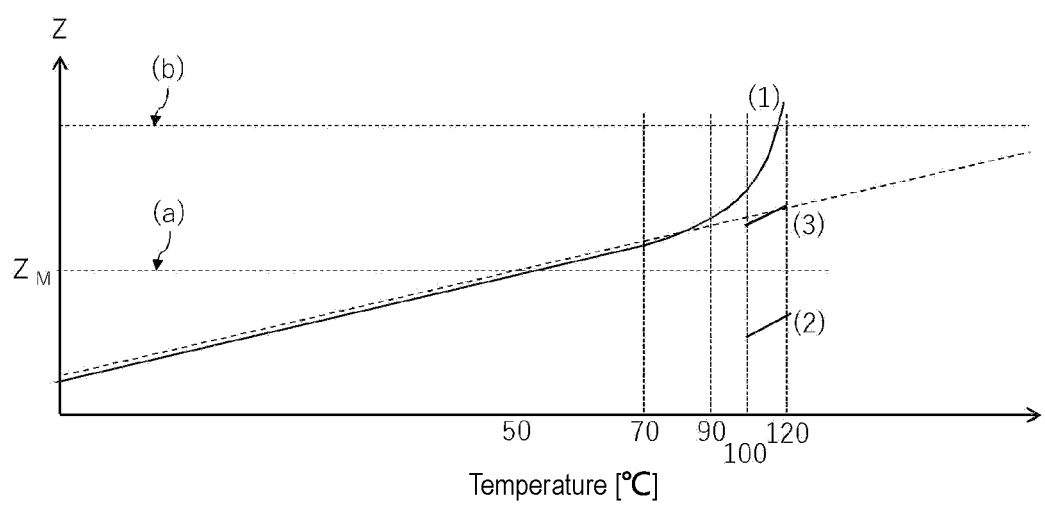
FIG. 2 is a graph illustrating an example of the relationship between the temperature and the cumulative value of the sensor device according to an embodiment.

FIG. 2 is a graph illustrating an example of the relationship between the temperature and the adjustment cumulative value Z of the sensor device according to this embodiment. The solid line shows an example in which the adjustment cumulative value Z output by the adder 14 with respect to temperature does not have linearity. The dashed line indicates the characteristics in a case where the adjustment cumulative value Z with respect to temperature has linearity. Further, the vertical dotted line is the threshold value of the adjustment cumulative value Z with respect to the temperature, and the area delimited by the vertical dotted line is the temperature range.

The control circuit 40 outputs a control signal of "0" from an output port 46 to the control port of the multiplexer 16. The multiplexer 16 selects and outputs the initial value of the count value output by the count value storage part 10 in response to receiving the control signal of "0." The offset value storage part 11 outputs the initial value of the offset value. Next, the control circuit 40 outputs a control signal instructing "load" from the output port 45 to a control port 22 of the counter 20. In response to receiving a control signal instructing "load," the counter 20 receives the initial value of the count value from the input port 21 and loads it into the internal register. The control circuit 40 loads from an output port 32 of the adjustment value storage part 30 the threshold value of the adjustment cumulative value Z for determining the temperature range from the input port 42. Here, the initial value of the count value (for example, 1000) and the initial value of the offset value are values according to the dashed line in FIG. 2.

The above is the initial setting of the sensor device 100, but the counter 20 may receive the count value for idling of the ΔΣ AD modulator 12 before the initial value of the count value is received. The idling of the ΔΣ AD modulator 12 is omitted for simplifying the description.

Next, the control circuit 40 outputs a control signal instructing "count down" from the output port 45 to the control port 22 of the counter 20. In response to receiving a control signal instructing "count down," the counter 20 starts counting down according to the clock signal and outputs the count value from the output port 23. The ΔΣ AD modulator 12 outputs the analog signal X output by the sensor 1 to the accumulator 13 as "0" and "1" data according to the clock signal. The accumulator 13 outputs the cumulative value Y obtained by accumulating the data to the adder 14 according to the clock signal. The adder 18 outputs the initial value of the offset value. The adder 14 outputs the adjustment cumulative value Z obtained by adding the cumulative value Y and the initial value of the offset value to the cumulative value latch part 15. At this time, since the cumulative value latch part 15 does not receive the latch signal from the control circuit 40, it does not output the digital signal ZN.

The above processing is the first first-order correction of the cumulative value Y of the sensor device 100. Next, a new first-order correction of the cumulative value Y will be described. As an example, the case where the adjustment cumulative value $Z_M$ when the count value C reaches a predetermined value M (for example, ½ of the initial value) is the value indicated by the dotted line in FIG. 2 will be described.

In a case where the count value C received from the counter 20 by the input port 41 reaches a predetermined value M (for example, 500), the control circuit 40 determines the temperature range from threshold values of the adjustment cumulative value $Z_M$ and the adjustment cumulative value Z received from the adder 14 by the input port 43, and determines the adjustment value to be selected.

In FIG. 2, in a case where the adjustment cumulative value $Z_M$ at the count value M is the value indicated by the dotted line (a), the control circuit 40 determines that the adjustment cumulative value $Z_M$ at the end of counting is the value indicated by the dotted line (b), and selects the temperature range (1) of 100° C. to 120° C. Then, control circuit 40 outputs a signal designating the temperature range (1) from the output port 44 to the input port 31 of the adjustment value storage part 30.

In response to receiving a signal designating the temperature range (1) at the input port 31, the adjustment value storage part 30 outputs an adjustment value (for example, −200) of the count value from the output port 33, and outputs the adjustment value of the offset value from the output port 34.

The adder 17 outputs to the multiplexer 16 an adjustment count value (for example, 300) obtained by adding the adjustment value of the count value to the count value M. The adder 18 outputs to the adder 14 an adjustment offset value obtained by adding the adjustment value of the offset value to the initial value of the offset value.

The control circuit 40 outputs a control signal "1" from the output port 46 to the multiplexer 16, and then outputs a control signal instructing "load" from the output port 45 to the control port 22 of the counter 20.

In response to receiving a control signal instructing "load," the counter 20 receives the adjustment count value output from the multiplexer 16 by the input port 21 and loads it into the internal register. Next, in response to receiving a control signal instructing "count down" from the output port 45 of the control circuit 40, the counter 20 restarts counting down according to the clock signal and outputs the count value from the output port 23. The adder 14 outputs the adjustment cumulative value Z obtained by adding the cumulative value Y and the adjustment offset value to the cumulative value latch part 15.

As described above, a new first-order correction of the cumulative value Y is started, and together with the first first-order correction, the adjustment cumulative value Z in which the nonlinear characteristic is corrected by polygonal line approximation may be obtained. Specifically, since the initial value of the count value is 1000 and the adjustment count value is 800, the curve (1) is corrected to the approximate straight line (2). Then, the approximate straight line (2) is corrected to the approximate straight line (3) by the adjustment offset value. That is, the adjustment value of the offset value is determined so as to ensure the continuity of the adjustment cumulative value Z.

The control circuit 40 outputs a latch signal from the output port 47 to the control port of the cumulative value latch part 15 in a case where the count value C received from the counter 20 becomes "0," that is, in a case where the countdown ends. In response to receiving the latch signal at the control port, the cumulative value latch part 15 latches the adjustment cumulative value Z received from the adder 14 and outputs the signal ZN. That is, the signal ZN corresponds to somewhere on the approximate straight line of (3), so it is a corrected digital signal corresponding to the analog signal X output by the sensor 1.

The above processing is a new first-order correction using the adjustment value of the count value and the adjustment value of the offset value corresponding to the temperature range of the cumulative value Y of the sensor device 100. By this processing, the signal ZN of the sensor device 100 is output as highly accurate digital data with corrected nonlinear characteristics.

As described above, the ΔΣ AD conversion circuit and sensor device according to this embodiment include the adjustment value storage part 30 which stores the adjustment value of the count value and the adjustment value of the offset value. Since the count value and the offset value are adjusted in the case where the count value of the counter reaches a predetermined value, it is possible to provide a ΔΣ AD converter and sensor device with a small circuit scale and high accuracy without requiring a multiplier circuit.

In this embodiment, the count value and the offset value are adjusted in the case where the count value C reaches the predetermined value M, but this may be performed multiple times. This is effective because when the adjustment cumulative value $Z_M$ is close to the threshold value of the adjustment cumulative value Z, rough adjustment and fine adjustment are possible.

Although the embodiments of the present invention have been described above, the present invention is not limited to the above embodiments, and various modifications may be made without departing from the scope of the present invention.

Figure 3:
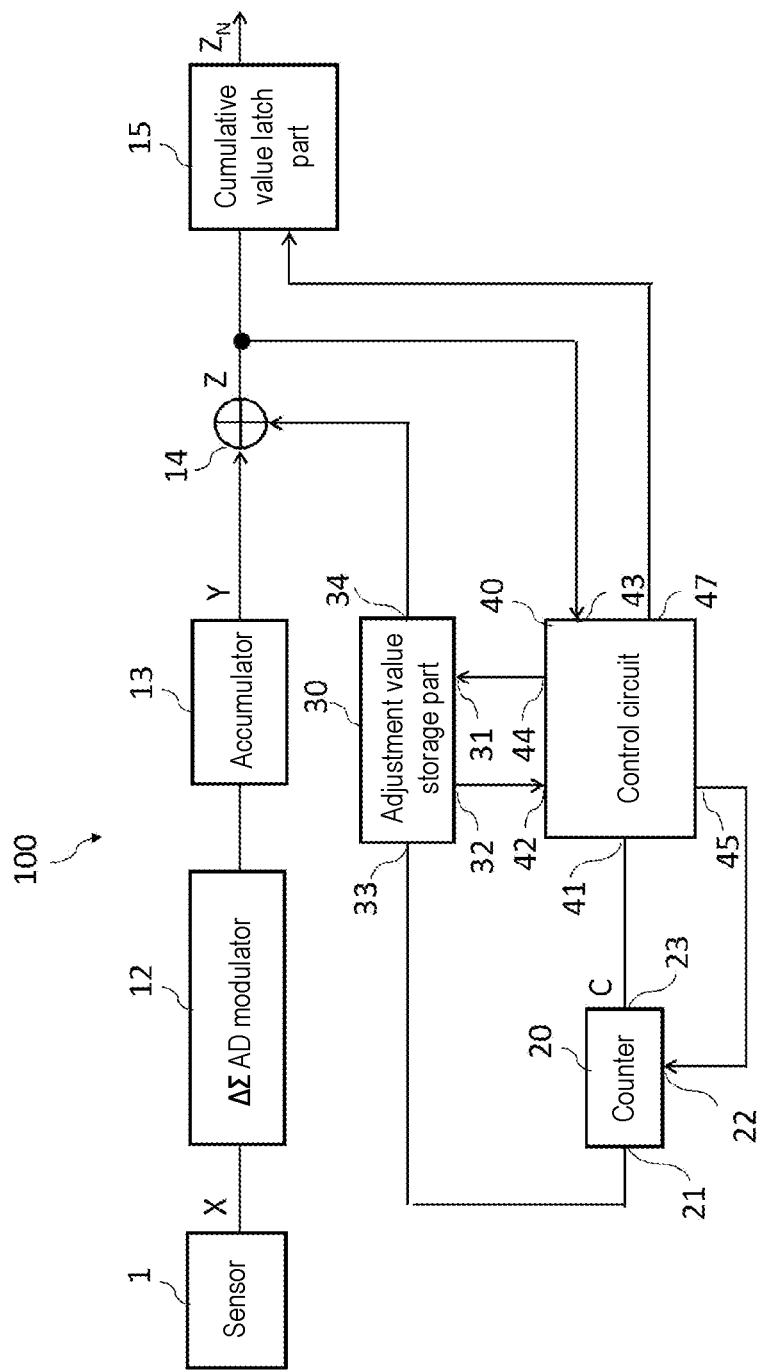
FIG. 3 is a block diagram illustrating another example of the sensor device according to an embodiment.
Figure 4:
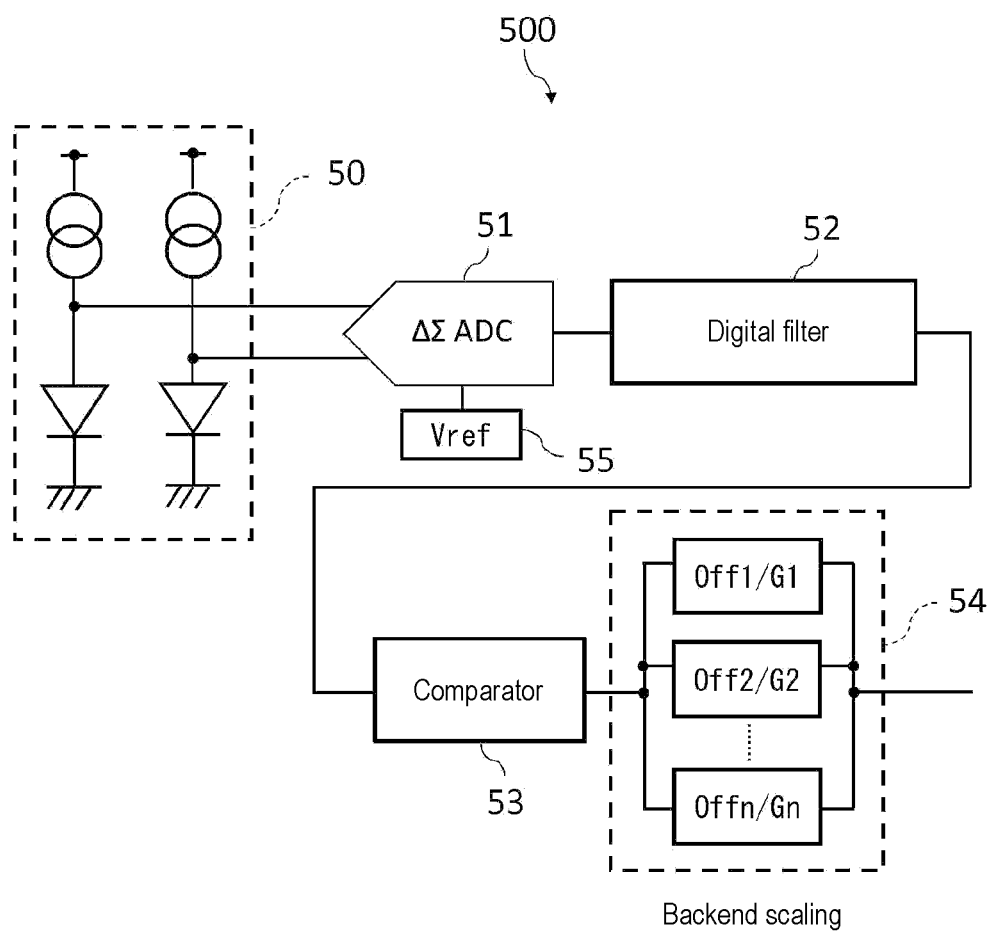
FIG. 4 is a block diagram illustrating a conventional sensor device.

For example, as shown in FIG. 3, the count value storage part 10 and the multiplexer 16 may be omitted if the counter 20 is configured so that the count value becomes the initial value when reset. Further, as shown in FIG. 3, the offset value storage part 11 and the adder 18 may be omitted if the accumulator 13 is configured so that the offset value becomes the initial value when reset. Further, if the predetermined value M of the count value is a fixed value and (the value M+the adjustment value of the count value) is stored in the adjustment value storage part 30, the adder 17 may be omitted.

Further, the input port 43 of the control circuit 40 receives the adjustment cumulative value Z, but it may receive the signal Y in the case where the polygonal line approximation is performed only once. Further, when no adjustment is required for the new first-order correction, "0" is output as the adjustment value of the count value and the adjustment value of the offset value.

What is claimed is:

1. A ΔΣ AD converter which converts an input analog signal into a digital signal, the ΔΣ AD converter comprising:

a ΔΣ AD modulator which receives the analog signal and outputs a modulated signal;

an accumulator which accumulates the modulated signal and outputs a cumulative value;

a counter which counts a set count value;

an adjustment value storage part which stores an adjustment value of the count value and an adjustment value of an offset value;

a first adder which outputs an adjustment cumulative value obtained by adding the cumulative value and the adjustment value of the offset value;

a cumulative value latch part which receives the adjustment cumulative value; and a control circuit which receives the adjustment cumulative value, the count value from the counter, and a threshold value of the adjustment cumulative value for determining a temperature range from the adjustment value storage part, and outputs a control signal to the counter and a latch signal to the cumulative value latch part, wherein the control circuit determines the temperature range according to the adjustment cumulative value received from the first adder in a case where the count value received from the counter reaches a predetermined value, and outputs a signal designating the temperature range to the adjustment value storage part, the adjustment value storage part outputs the adjustment value of the offset value and the adjustment value of the count value according to the designated temperature range to the first adder and the counter, and the control circuit outputs the latch signal to the cumulative value latch part in response to completion of counting by the counter.

2. The ΔΣ AD converter according to claim 1, wherein the adjustment value of the count value of the adjustment value storage part is an adjustment count value including the predetermined value.

3. The ΔΣ AD converter according to claim 2, further comprising:

a count value storage part which stores an initial value of the count value to be set in the counter; and a multiplexer which selects the adjustment count value and the initial value of the count value and outputs them to the counter, wherein the control circuit outputs a control signal for selecting the adjustment count value and the initial value of the count value to the multiplexer, and outputs a control signal for loading the count value output by the multiplexer or counting the set count value to the counter.

4. The ΔΣ AD converter according to claim 3, further comprising:

an offset value storage part which stores an initial value of the offset value; and a third adder which outputs an adjustment offset value obtained by adding the adjustment value of the offset value and the initial value of the offset value, wherein the first adder outputs the adjustment cumulative value obtained by adding the cumulative value and the adjustment offset value.

5. The ΔΣ AD converter according to claim 2, further comprising:

an offset value storage part which stores an initial value of the offset value; and a third adder which outputs an adjustment offset value obtained by adding the adjustment value of the offset value and the initial value of the offset value, wherein the first adder outputs the adjustment cumulative value obtained by adding the cumulative value and the adjustment offset value.

6. The ΔΣ AD converter according to claim 1, further comprising:

a second adder which outputs an adjustment count value obtained by adding the count value of the counter and the adjustment value of the count value to the counter.

7. The ΔΣ AD converter according to claim 6, further comprising:

a count value storage part which stores an initial value of the count value to be set in the counter; and a multiplexer which selects the adjustment count value and the initial value of the count value and outputs them to the counter, wherein the control circuit outputs a control signal for selecting the adjustment count value and the initial value of the count value to the multiplexer, and outputs a control signal for loading the count value output by the multiplexer or counting the set count value to the counter.

8. The ΔΣ AD converter according to claim 7, further comprising:

an offset value storage part which stores an initial value of the offset value; and a third adder which outputs an adjustment offset value obtained by adding the adjustment value of the offset value and the initial value of the offset value, wherein the first adder outputs the adjustment cumulative value obtained by adding the cumulative value and the adjustment offset value.

9. The ΔΣ AD converter according to claim 6, further comprising:

an offset value storage part which stores an initial value of the offset value; and a third adder which outputs an adjustment offset value obtained by adding the adjustment value of the offset value and the initial value of the offset value, wherein the first adder outputs the adjustment cumulative value obtained by adding the cumulative value and the adjustment offset value.

10. The ΔΣ AD converter according to claim 1, further comprising:

an offset value storage part which stores an initial value of the offset value; and a third adder which outputs an adjustment offset value obtained by adding the adjustment value of the offset value and the initial value of the offset value, wherein the first adder outputs the adjustment cumulative value obtained by adding the cumulative value and the adjustment offset value.

11. A sensor device comprising:

a sensor element which outputs an analog signal corresponding to measured physical information; and the ΔΣ AD converter according to claim 1 which receives the analog signal.

12. The sensor device according to claim 11, wherein the adjustment value of the count value of the adjustment value storage part is an adjustment count value including the predetermined value.

13. The sensor device according to claim 11, wherein the ΔΣ AD converter further comprises a second adder which outputs an adjustment count value obtained by adding the count value of the counter and the adjustment value of the count value to the counter.

* * * * *